(12) United States Patent
Lee et al.

(10) Patent No.: US 10,756,149 B2
(45) Date of Patent: Aug. 25, 2020

(54) ORGANIC LIGHT EMITTING DISPLAY DEVICE

(71) Applicant: LG Display Co., Ltd., Seoul (KR)

(72) Inventors: Jaesung Lee, Paju-si (KR); Jonghyeok Im, Paju-si (KR); Dohyung Kim, Paju-si (KR); Seungwon Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 39 days.

(21) Appl. No.: 16/214,713

(22) Filed: Dec. 10, 2018

(65) Prior Publication Data

US 2019/0189710 A1  Jun. 20, 2019

(30) Foreign Application Priority Data

Dec. 19, 2017 (KR) .................. 10-2017-0174848

(51) Int. Cl.
*H01L 27/32* (2006.01)
*H01L 51/52* (2006.01)

(52) U.S. Cl.
CPC ...... *H01L 27/3246* (2013.01); *H01L 51/5225* (2013.01); *H01L 51/5231* (2013.01); *H01L 51/5237* (2013.01); *H01L 51/5256* (2013.01); *H01L 51/5271* (2013.01)

(58) Field of Classification Search
CPC ................................................. H01L 27/3246
See application file for complete search history.

(56) References Cited

U.S. PATENT DOCUMENTS

| | | | |
|---|---|---|---|
| 9,105,866 B2 | 8/2015 | Yoon | |
| 2014/0361265 A1* | 12/2014 | Liu | H01L 51/5271 257/40 |

FOREIGN PATENT DOCUMENTS

KR  10-2015-0016777 A  2/2015

* cited by examiner

*Primary Examiner* — William A Harriston
(74) *Attorney, Agent, or Firm* — Morgan, Lewis & Bockius LLP

(57) ABSTRACT

Disclosed is an organic light emitting display device including: an organic light emitting diode disposed in a first area of a substrate; and a reflective layer disposed in a second area adjacent to the first area. The reflective layer electrically contacts a cathode of the organic light emitting diode.

14 Claims, 7 Drawing Sheets

ORGANIC LIGHT EMITTING DISPLAY DEVICE

This application claims the benefit of Korea Patent Application No. 10-2017-0174848 filed on Dec. 19, 2017, the entire contents of which is incorporated herein by reference for all purposes as if fully set forth herein.

BACKGROUND

Technical Field

The present disclosure relates to an organic light emitting display device.

Discussion of the Related Art

An organic light emitting device among flat panel display devices is a self-luminescent display device that emits light by electrically exciting an organic compound. Because an LCD using an organic light emitting device does not require a backlight, a decrease in weight and thickness of the LCD is possible and manufacturing processes can be simplified. Further, the organic light emitting device can be manufactured in a low temperature, has a high response speed of 1 ms or less, and has characteristics such as low power consumption, a wide viewing angle, and a high contrast.

The display device is used in an increasingly wider range of fields, and accordingly more diverse technologies are required for the display device.

SUMMARY

Accordingly, embodiments of the present disclosure are directed to an organic light emitting display device that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting display device comprises an organic light emitting diode disposed in a first area of a substrate; and a reflective layer disposed in a second area adjacent to the first area. The reflective layer electrically contacts a cathode of the organic light emitting diode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
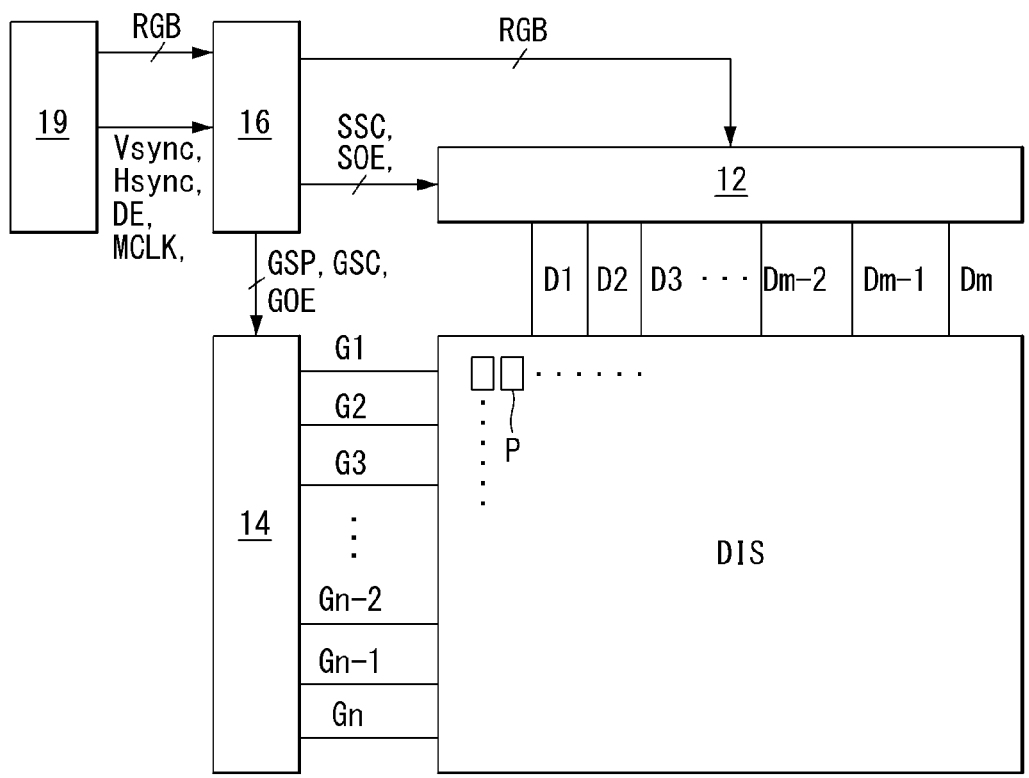
FIG. 1 is a block diagram schematically illustrating an organic light emitting display device.

Hereinafter, exemplary embodiments of this invention will be described in detail with reference to the accompanying drawings, wherein same reference numerals may be used to denote the same or substantially the same elements throughout the specification and the drawings. In the following description, well-known functions or constructions related to this disclosure are not omitted if they would obscure gist of this disclosure in unnecessary. In describing various exemplary embodiments, descriptions of the same or like components will be given in the beginning but omitted in other exemplary embodiments.

It will be understood that although the terms first, second, etc. may be used herein to describe various elements, these elements should not be limited by these terms. These terms are generally only used to distinguish one element from another.

Figure 2:
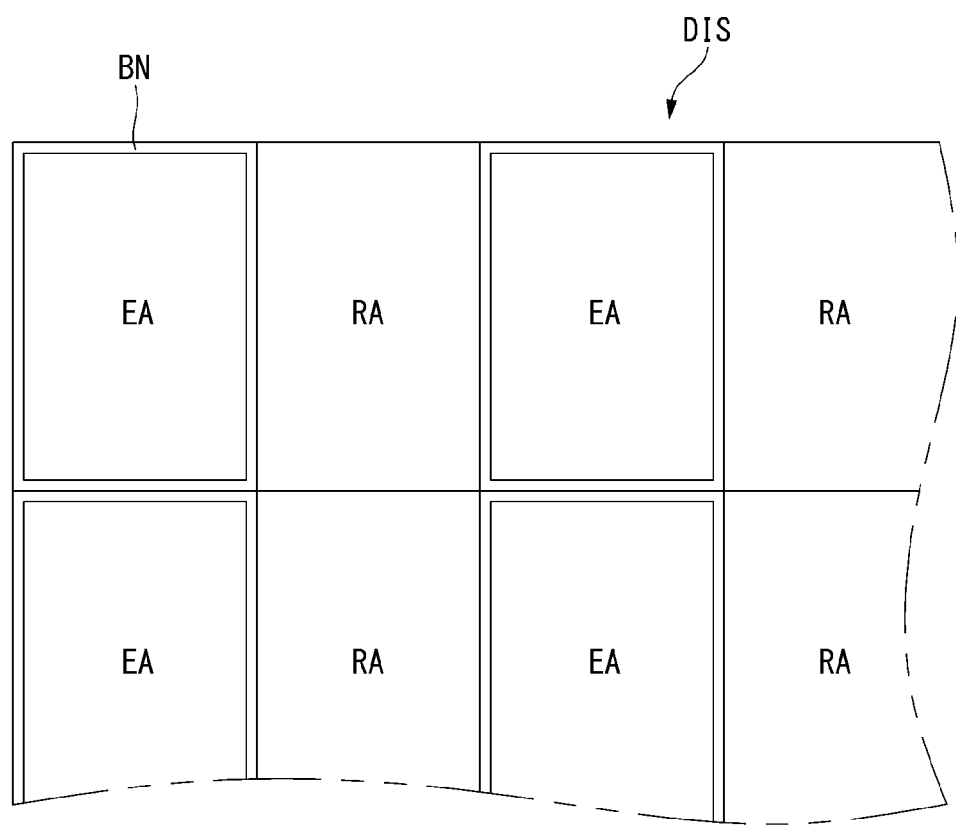
FIG. 2 is a diagram schematically illustrating configuration of a pixel shown in FIG. 1.

FIG. 1 is a block diagram schematically illustrating an organic light emitting display device. FIG. 2 is a diagram schematically illustrating configuration of a pixel shown in FIG. 1.

Referring to FIG. 1, an organic light emitting display device 10 according to the present disclosure includes a driving circuit and a display panel DIS. The driving circuit includes a data driver 12, a gate driver 14, and a timing controller 16.

The data driver 12 generates an analog data voltage based on digital video data RGB received from the timing controller 16. A data voltage output from the data driver 12 is supplied to data lines D1 to Dm.

The gate driver 14 supplies a gate signal in sync with the data voltage to gate lines G1 to Gn, sequentially, and selects pixels of the display panel DIS into which the data voltage is written.

The timing controller 16 receives a timing signal, such as a vertical synchronization signal Vsync, a horizontal synchronization signal Hsync, a data enable signal DE, and a main clock MCLK, from a host system 19 to synchronize an operation timing of the data driver 12 and an operation timing of the gate driver 14 with each other. A data timing control signal for controlling the data driver 12 includes a source sampling clock (SSC), a source output enable signal SOE, etc. A gate timing control signal for controlling the gate driver 14 includes a gate start pulse GSP, a gate shirt clock GSC, a gate output enable signal GOE, etc.

The host system 19 may be implemented as any one of a television system, a set top box, a navigation system, a DVD player, a Blu-ray player, a personal computer (PC), a home theater system, and a phone system. The host system 19 includes a System on Chip (SoC) embedded with a scaler and converts digital video data RGB of a received image to a format suitable to display the received image on the display panel DIS. The host system 19 transmits timing signals Vsync, Hsync, DE, and MCLK in addition to the digital video data to the timing controller 16.

In addition, the timing controller 16 includes a mode controller 100 for controlling mode setting of the display device.

A power unit 200 generates a voltage to be applied to the display panel DIS. The power unit 200 generates a high-potential driving voltage EVDD and a low-potential voltage EVSS to drive pixels. In addition, the power unit 200 generates a second voltage VLC2 to be applied to a second electrode E2 of a reflection area RA.

The display panel DIS includes a pixel array. The pixel array includes pixels which are defined by the data lines D1 to Dm (m is a positive integer) and the gate lines G1 to Gn (n is a positive integer). Each of the pixels includes an organic light emitting diode which is a self-emitting element.

FIG. 2 is a schematic diagram illustrating a flat array of a display panel.

Referring to FIGS. 1 and 2, the display panel DIS includes the reflection area RA for reflecting light, and a light emitting area EA for displaying an image.

The reflection area RA may reflect external light so as to allow the display panel DIS to perform a mirror function. The light emitting area EA may be separated by a bank layer BN, and each separated light emitting area EA includes one or more pixels P. For example, three-color pixels R, G, B, or pixels P of R, G, B W may be arranged in the light emitting area EA.

Figure 3:
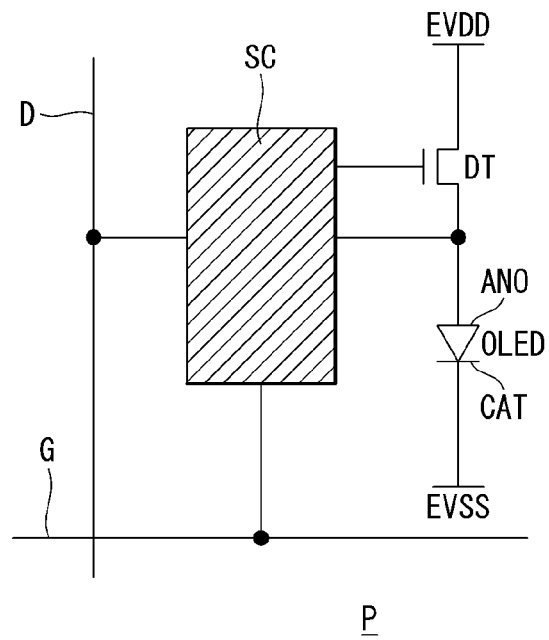
FIG. 3 is a diagram illustrating an example of a pixel disposed in a light emitting area.

FIG. 3 is a diagram illustrating an example of a pixel disposed in a light emitting area.

Referring to FIG. 3, a pixel P is connected to a data line D and a gate line G. The pixel P includes an organic light emitting diode OLED, a driving transistor DT for controlling an amount of current flowing through the organic light emitting diode OLED, and a programming unit SC for controlling operation of the driving transistor DT. The programming unit SC is composed of one or more transistors and one or more capacitors, and controls voltages of major nodes such as a gate electrode and a source electrode of the driving transistor DT. For example, in response to a gate pulse applied from the gate line G, the programming unit SC writes a data voltage, received from the data line D, into the programming unit SC. The driving transistor DT supplies a driving current, which is proportional to a size of the data voltage written into the programming unit SC, to the organic light emitting diode OLED. The organic light emitting diode OLED emits light in proportion to a size of the driving current supplied from the driving transistor DT. The organic light emitting diode OLED includes an anode ANO, a cathode CAT, and an organic compound layer interposed between the anode ANO and the cathode CAT. The anode ANO is connected to the driving transistor DT.

Figure 4:
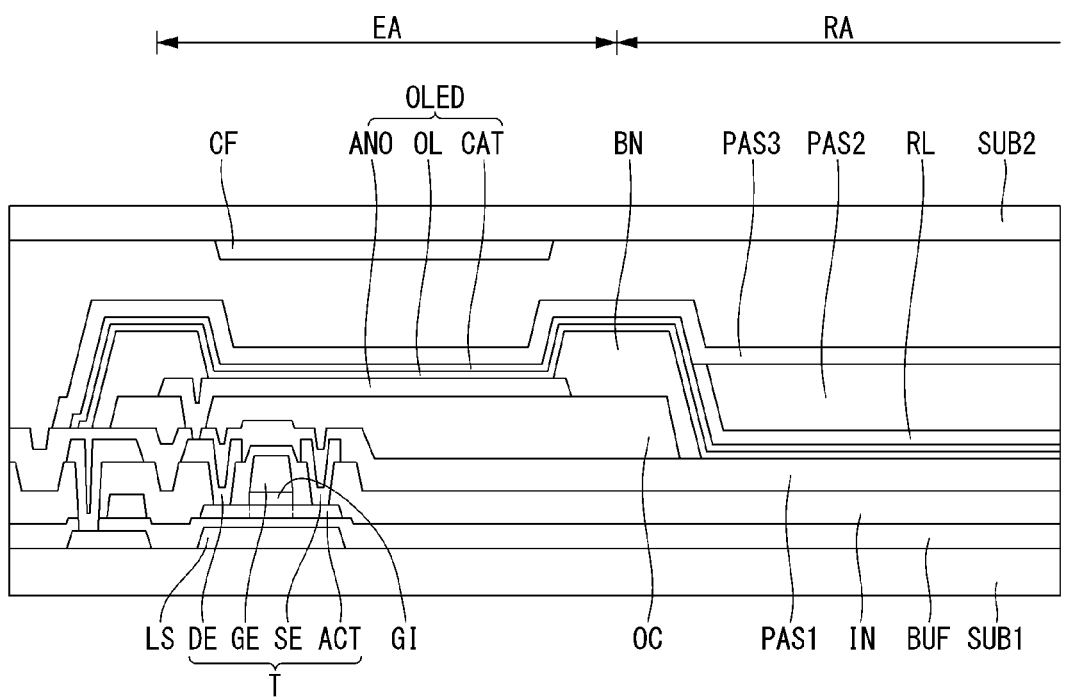
FIG. 4 is a diagram illustrating an organic light emitting display device according to a first embodiment.

FIG. 4 is a diagram illustrating an organic light emitting display device according to a first embodiment.

Referring to FIG. 4, the organic light emitting display device according to a first embodiment includes a transistor T, a first substrate SUB1 on which an organic light emitting diode OLED is formed, and a second substrate SUB2 on which a color filter CF is formed. The transistor T and the organic light emitting diode OLED are disposed in a light emitting area EA, and display an image.

The first substrate SUB1 may be formed of a glass or plastic material. To have a flexible characteristic, the first substrate SUB1 may be formed of PI(Polyimide), PET (polyethylene terephthalate), PEN(polyethylene naphthalate), PC(polycarbonate), etc.

A light shielding layer LS and a low-potential voltage line VSSL are disposed on the first substrate SUB1. The light shielding layer LS is disposed to overlap a semiconductor layer of the transistor T, especially a channel, on a plane so as to protect an oxide semiconductor element from external light.

A buffer layer BUF is disposed on the first substrate SUB1 to cover the light shielding layer LS and the low-potential voltage line VSSL. The buffer layer BUF prevents ions or impurities from spreading on the first substrate SUB1, and prevents external moisture from permeating into the first substrate SUB1.

A semiconductor layer ACT is disposed on the buffer layer BUF. By patterning an insulating layer on the buffer layer BUF to cover the semiconductor layer ACT, a gate insulating layer GI is disposed at a position where a gate electrode GE is to be formed.

The gate insulating layer GI insulates the gate electrode GE and may be composed of a silicon oxygen layer (SiOx).

The gate electrode GE is disposed on the gate insulating layer GI.

The gate electrode GE is disposed to face the semiconductor layer ACT with the gate insulating layer GI therebetween. The gate electrode GE may be composed of a single layer or multiple layers formed of one of copper (Cu), molybdenum (Mo), aluminum (Al), chrome (Cr), gold (Au), titanium (Ti), nickel (Ni), neodymium (Nd), tantalum (Ta), tungsten (W), or alloys thereof.

An interlayer insulating layer IN is disposed on the buffer layer BUF to cover the gate electrode GE. The interlayer insulating layer IN insulates the gate electrode GE and a source/drain electrode SE or DE from each other, and may be formed of a silicon oxide layer (SiOx), a silicon nitride layer (SiNx), or multiple layers thereof.

The source/drain electrode SE or DE is disposed on the interlayer insulating layer IN.

The source electrode SE and the drain electrode DE are spaced a predetermined distance apart from each other. The source electrode SE comes into contact with one side of the semiconductor layer ACT through a source contact hole which penetrates the interlayer insulating layer IN. The drain electrode DE comes into contact the other side of the semiconductor layer ACT through a drain contact hole which penetrates the interlayer insulating layer IN. The source electrode SE and the drain electrode DE may be composed of a single layer or multiple layers. The source electrode SE and the drain electrode DE, if composed of a single layer, may be composed of molybdenum (Mo), aluminum (Al), chrome (Cr), gold (Au), titanium (Ti), nickel (Ni), neodymium (Nd), copper (Cu), or alloys thereof. The source electrode SE and the drain electrode DE, if composed of multiple layers, may be composed of two layers of molybdenum/aluminum-neodymium, molybdenum/aluminum, or titanium/aluminum, or three layers of molybdenum/aluminum-neodymium/molybdenum, molybdenum/aluminum/molybdenum, titanium/aluminum/titanium, or molybdenum titanium/copper/molybdenum titanium.

The semiconductor layer ACT, the gate electrode GE, and the source/drain electrode SE or DE forms the transistor T.

A first passivation layer PAS1 is positioned on the transistor T. The first passivation layer PAS1 protects the transistor T, and may be formed of silicon oxide (SiOx), silicon nitride (SiNx), or multiple layers thereof.

A planarization layer OC is positioned on the first passivation layer PAS1. The planarization layer OC makes irregularities thereunder flat, and may be formed of an organic material such as photo acryl, polyimide, benzocyclobutene resin, acrylate resin, etc. Thus, if necessary, any one of the first passivation layer PAS1 and the planarization layer OC may be omitted.

An anode ANO is disposed on the planarization layer OC.

The anode ANO is connected with the drain electrode DE of the transistor T through a contact hole which penetrates the first passivation layer PAS1 and the planarization layer OC. The anode ANO may be in a three-layer structure in which a reflective layer is interposed between transparent electrodes. The transparent electrodes may be composed of a transparent metal material of Indium Tin Oxide(ITO) or the like, and the reflective layer may be composed of aluminum (Al), copper (Cu), silver (Ag), nickel (Ni), molybdenum (Mo), molybdenum titanium (MoTi), etc.

A bank layer BN for separating the light emitting area EA of the pixel P is positioned on the first substrate SUB1 on which the anode ANO is formed. The bank layer BN may be formed of an organic material such as polyimide, benzocyclobutene resin, acrylate resin, etc.

The bank layer BN may be disposed to cover a side end of the anode ANO while exposing the anode ANO. It is desirable that the exposed area of the anode ANO is designed at maximum to achieve a sufficient aperture ratio.

The planarization layer OC and the bank layer BN may not be disposed on the reflection area RA in order to prevent a Yellowish phenomenon in the reflection area RA. The yellowish phenomenon refers to a phenomenon in which faded yellow is displayed due to material properties of the planarization layer OC and the bank layer BN.

The organic light emitting layer OL may be formed widely on a front surface of the first substrate SUB1.

The cathode CAT is positioned on the organic light emitting layer OL. The cathode CAT may be formed of a transparent conductive material such as Indium Tin Oxide (ITO) and Indium Zinc Oxide (IZO), and may be composed of magnesium (Mg), calcium (Ca), aluminum (Al), silver (Ag), or alloys thereof which have a thickness thin enough to allow light to pass therethrough. The cathode CAT is deposited on the organic light emitting layer OL of the light emitting area EA, and may be arranged in even up to the reflection area RA, as shown in the drawing. That is, after the cathode CAT is formed, patterning is not performed, as shown in the drawing, for a simple process.

In the reflection area RA, a reflective layer RL is disposed on the cathode CAT. The reflective layer RL may be disposed in an area of the reflection area RA. The reflective layer RL may be curved to face a side wall of the bank layer BN so that a reflectance increases further.

Unlike the example shown in the drawing, the reflective layer RL may extend up to a partial area of the light emitting area EA so that a reflectance increases although a luminance decreases. The reflective layer RL may be formed using aluminum (Al), copper (Cu), silver (Ag), nickel (Ni), molybdenum (Mo), molybdenum titanium (MoTi), etc. The reflective layer RL electrically contacts the cathode CAT.

An organic passivation layer PAS2 (hereinafter, referred to as a second passivation layer) is disposed on the reflective layer RL. The second passivation layer PAS2 may be formed in a shape such that the second passivation layer PAS2 buries the reflection area RA which is concave compared to the light emitting area EA. The second passivation layer PAS2 may be of an organic polymer. The second passivation layer PAS2 delays permeated moisture from spreading.

An inorganic passivation layer PAS3 (hereinafter, referred to as a third passivation layer) is disposed on the second passivation layer PAS2. The third passivation layer PAS3 may be formed over the front surface of the first substrate SUB1. Using an inorganic layer such as a silicon nitride layer (SiNx), the third passivation layer PAS3 may prevent external moisture from permeating.

In the organic light emitting display device according to the first embodiment, the reflective layer RL electrically contacts the cathode CAT. The reflective layer RL may be applied with a low-potential voltage EVSS, and accordingly, the reflective layer RL may function as an auxiliary line of the cathode CAT. The low-potential voltage EVSS applied to the cathode CAT affects luminance of light emitted by the organic light emitting diode OLED. Even though the same low-potential voltage EVSs is applied to cathodes CAT of all pixels P, different voltage levels may be applied to the cathodes according to positions of the pixels P.

There is a well-known technique of forming an auxiliary line in the first substrate SUB1, forming a partition in the planarization layer OC, and bringing the auxiliary line and the cathode into contact with each other through a contact hole in order to improve a voltage deviation of the cathode CAT. To use this technique, a process of forming a partition needs to be added.

On the contrary, the present disclosure may keep the reflective layer RL, which functions as the reflection area RA, into contact with an electrode of the cathode CAT, and accordingly, it may improve a voltage deviation of the cathode CAT of the organic light emitting diode OLED without additionally forming a partition. In addition, the present disclosure does not form a partition, so an creased area of the light emitting area EA due to the presence of the partition may be addressed and thus luminance may increase.

On the second substrate SUB2, the color filter CF is disposed in the area of the light emitting area EA. The first substrate SUB1 and the second substrate SUB2 may be attached while a spacer (not shown) is interposed between the first substrate SUB1 and the second substrate SUB2 to secure a space. A filler may be formed in an area of the light emitting area EA between the first substrate SUB1 and the second substrate SUB2.

Figure 5:
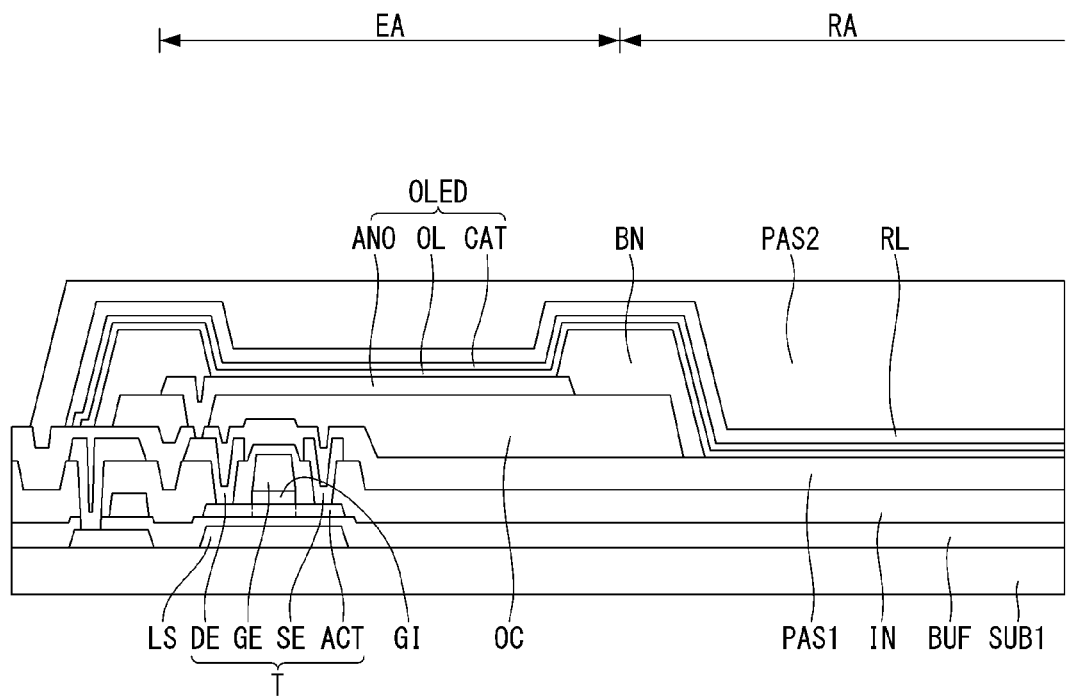
FIGS. 5 to 7 are diagrams illustrating a method of forming the organic light emitting display device according to the first embodiment.
Figure 6:
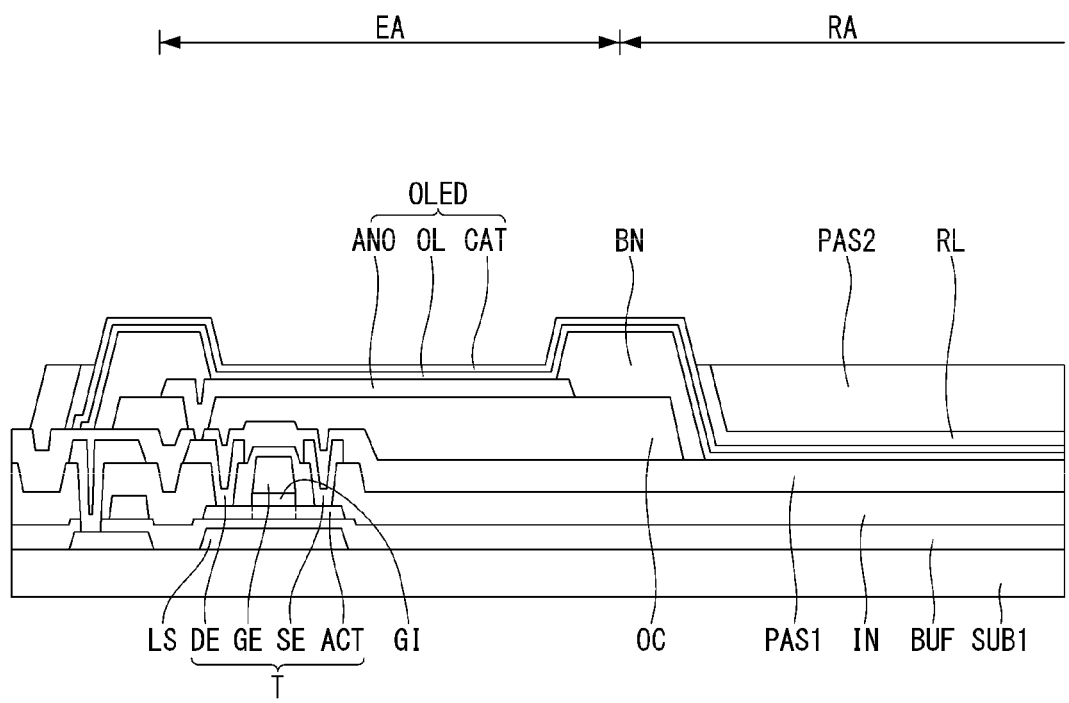
Figure 7:
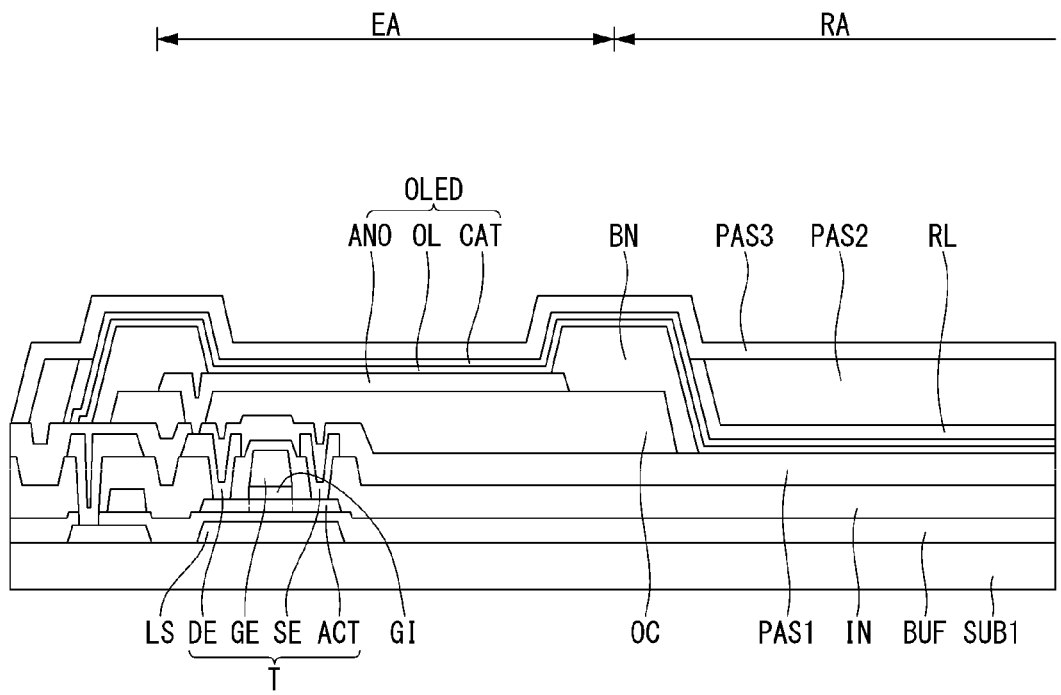

FIGS. 5 to 7 are diagrams illustrating a process of forming the organic light emitting device, shown in FIG. 4, according to the first embodiment.

Referring to FIG. 5, the organic light emitting layer OL and the cathode CAT are sequentially formed on the first passivation layer PAS1 on which the bank layer BN is formed in the first substrate SUB1. Next, the reflective layer RL is formed over the front surface of the first substrate SUB1. In addition, the second passivation layer PAS2 is formed over the front surface of the first substrate SUB1 to cover the reflective layer RL. The second passivation layer PAS2 may be formed by coating polymers or using a inkjet printing method.

Referring to FIG. 6, part of the second passivation layer PAS2 and part of the reflective layer RL are etched to an extent where the reflective layer RL positioned in the area of the light emitting area EA is removable. As a process of removing the second passivation layer PAS2 and the reflective layer RL, a dry etching process may be used.

Referring to FIG. 7, the third passivation layer PAS3 is formed over the front surface of the first substrate SUB1.

Figure 8:
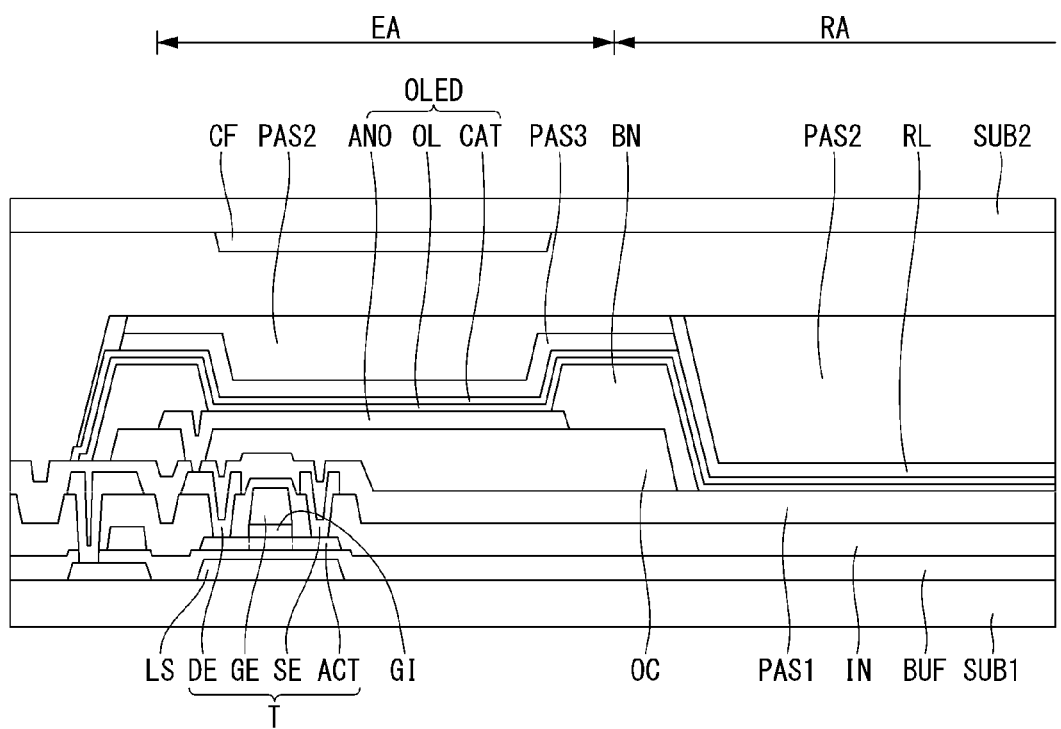
FIG. 8 is a diagram illustrating an organic light emitting display device according to a second embodiment.

FIG. 8 is a diagram illustrating an organic light emitting display device according to a second embodiment. Detailed description of components similar to or substantially the same as the components of the above exemplary embodiments will be omitted.

Referring to FIG. 8, a planarization layer OC is formed on a first passivation layer PAS1 in a first substrate SUB1, and an anode ANO is disposed on the planarization layer OC. A bank layer BN for separating a light emitting area EA of a pixel P is positioned on the first substrate SUB1 in which the ANO is formed. An organic light emitting layer OL is positioned on the front surface of the first substrate SUB1 to cover the bank layer BN, and a cathode CAT is positioned on the organic light emitting layer OL.

In the light emitting area EA, a third passivation layer PAS3 is disposed on the cathode CAT. In addition, a second passivation layer PAS2 is disposed on the third passivation layer PAS3.

In the reflection area RA, the reflective layer RL is disposed on the cathode CAT. The reflective layer RL electrically contacts the cathode CAT. The second passivation layer PAS2 is disposed on the reflective layer RL. The second passivation layer PAS2 may be formed in a shape such that the second passivation layer PAS2 buries the reflection area RA which is concave compared to the light emitting area EA.

The organic light emitting display device according to the second embodiment may perform a reflecting function using the reflective layer RL, while performing an auxiliary electrode function of the cathode CAT using the reflective layer RL. Thus, it is possible to simplify a process, improve a luminance deviation of the light emitting area EA, and perform a reflecting function at the same time.

FIGS. 9 to 12 are diagrams illustrating a method of forming the organic light emitting display device according to the second embodiment.

Figure 9:
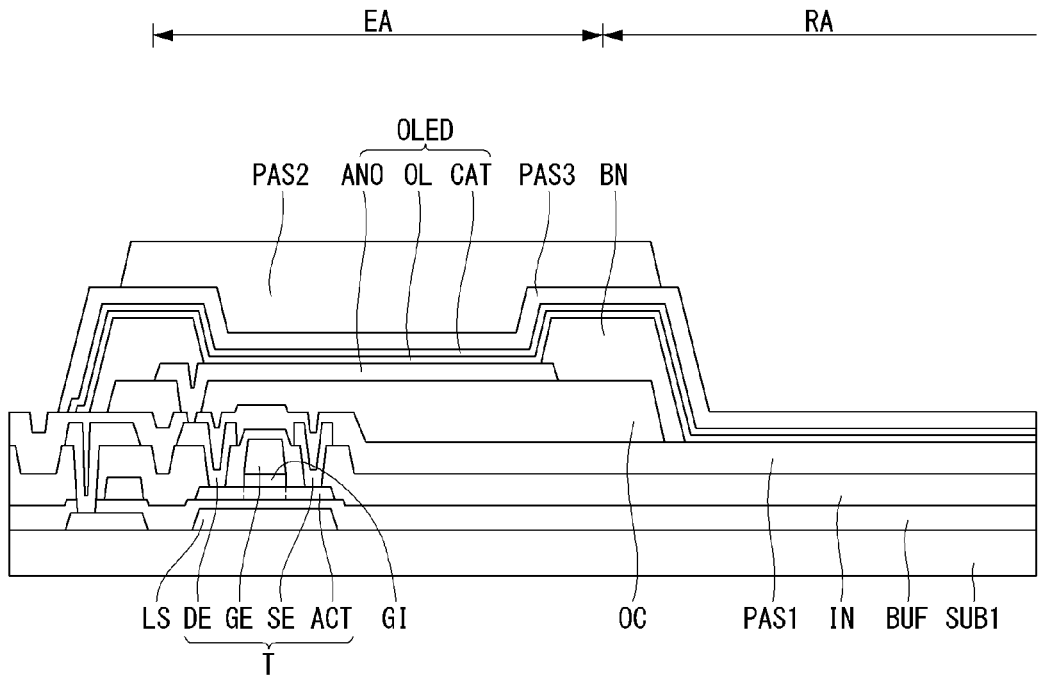
FIGS. 9 to 12 are diagrams illustrating a method of forming the organic light emitting display device according to the second embodiment.

Referring to FIG. 9, the organic light emitting layer OL and the cathode CAT are sequentially formed on the first passivation layer PAS1 on which the bank layer BN is formed in the first substrate SUB1. Next, the third passivation layer PAS3 is formed over the front surface of the first substrate SUB1. In addition, only within the area of the light emitting area EA, the second passivation layer PAS2 is formed on the third passivation layer PAS3. The second passivation layer PAS2 shown in FIG. 9 may be formed in a manner in which a second passivation layer is formed over the front surface of the first substrate SUB1 and then the second passivation layer positioned in the area of the reflection area RA is removed. The second passivation layer PAS2 may be formed by coating polymers or using an inkjet printing method.

Figure 10:
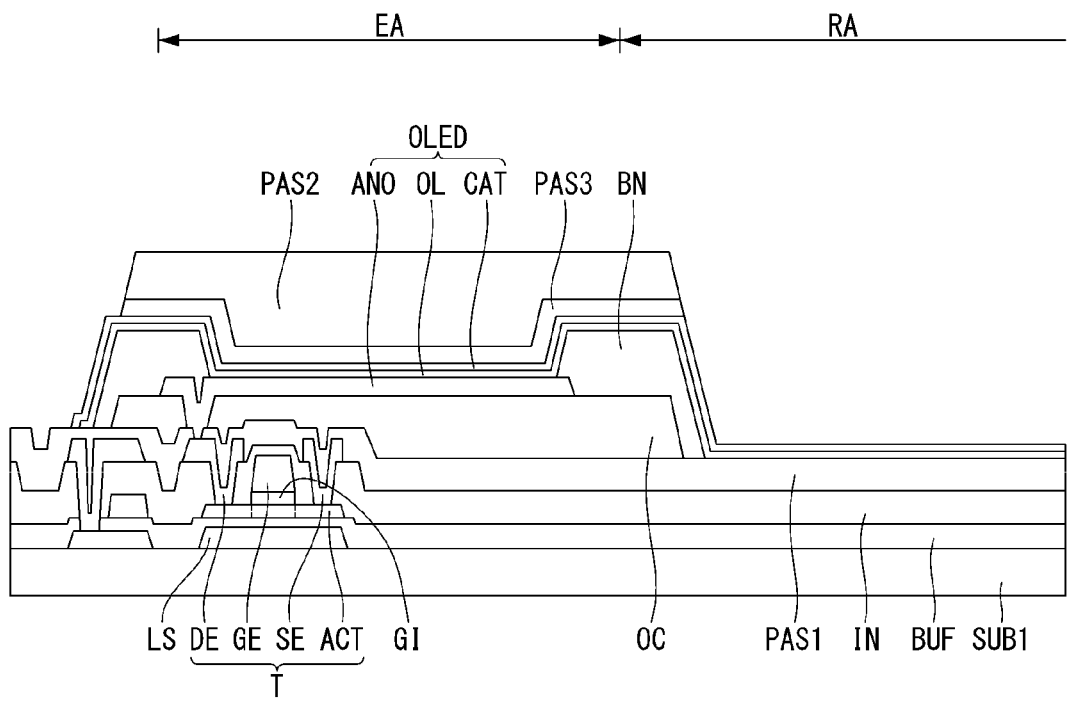

Referring to FIG. 10, the second passivation layer PAS2 positioned in the area of the light emitting area EA is removed. As a process of removing the second passivation layer PAS2, a dry etching process may be used.

Figure 11:
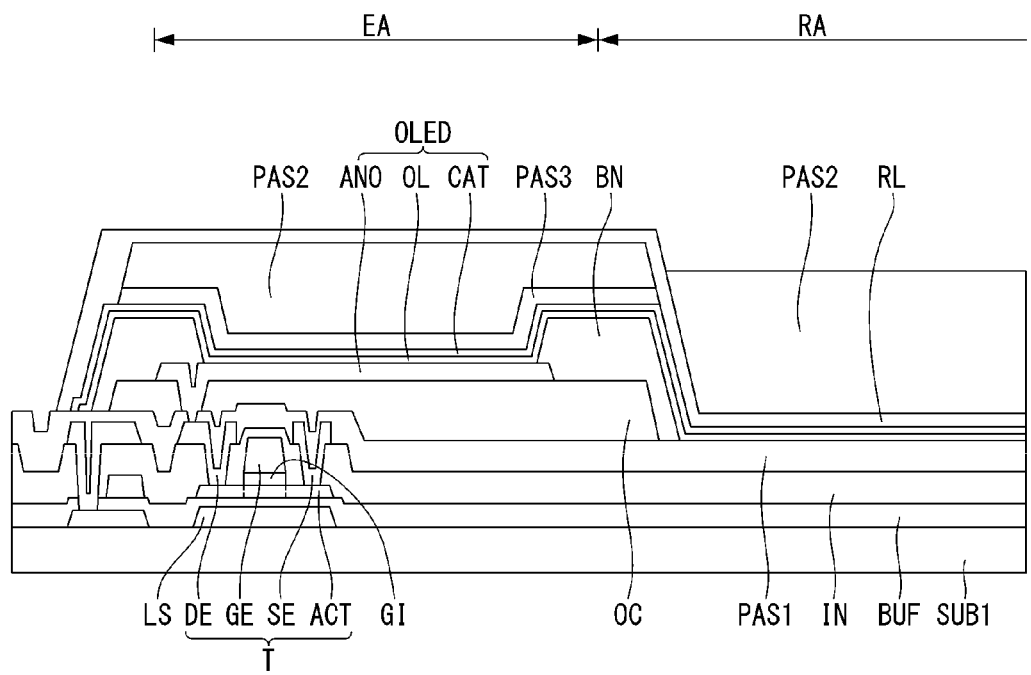

Referring to FIG. 11, the reflective layer RL is formed over the front surface of the first substrate SUB1. In addition, the second passivation layer PAS2 is formed in the area of the reflection area RA. To this end, the second passivation layer PAS2 may be formed over the front surface of the first substrate SUB1, and the second passivation layer PAS2 may be removed to expose the reflection area RA.

Figure 12:
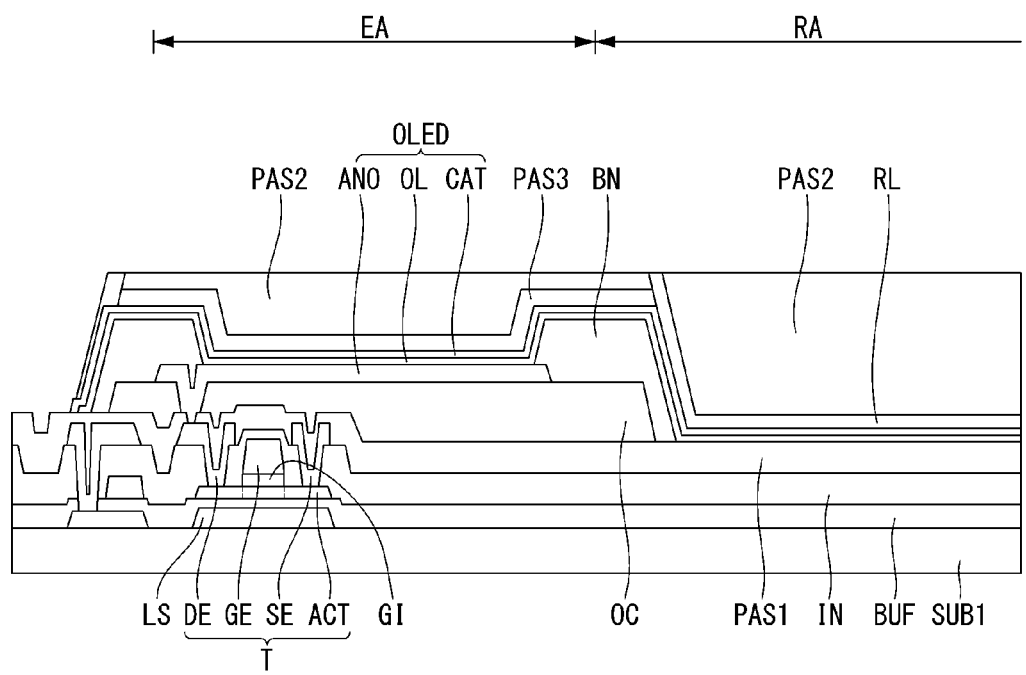

Referring to FIG. 12, the reflective layer RL may be etched by a dry etching process or the like so as to expose the light emitting area EA.

The present disclosure may separate a display panel area into a light emitting area and a mirror area, and display an image while performing a mirror function.

The present disclosure may improve an image quality by improving a deviation of a positive voltage applied to an organic light emitting diode of a light emitting area. In particular, the present disclosure does not require an additional configuration in the light emitting area in order to form an auxiliary line for improving a deviation of a positive voltage, and thus, it is possible to simplify a process and increase an aperture ratio of the light emitting area.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
an organic light emitting diode disposed in a first area of a substrate; and
a reflective layer disposed in a second area adjacent to the first area on the substrate,
wherein the reflective layer is overlapped with an organic light emitting layer of the organic light emitting diode in the second area.

2. The organic light emitting display device of claim 1, wherein the organic light emitting diode comprises:
an anode disposed in the first area;
the organic light emitting layer disposed on the anode and extended to the second area; and
a cathode disposed on the organic light emitting layer and positioned in the first area and the second area,
wherein the reflective layer is disposed on the cathode.

3. The organic light emitting display device of claim 2, wherein the cathode is integrally formed to cover the first area and the second area.

4. The organic light emitting display device of claim 2, further comprising a bank layer which defines the first area and the second area on the substrate, wherein the reflective layer has a curved shape to face a side surface of the bank layer.

5. The organic light emitting display device of claim 4, wherein the bank layer contacts part of the anode of the organic light emitting diode.

6. The organic light emitting display device of claim 1, wherein at least one of an organic passivation layer or an inorganic passivation layer is disposed to cover the organic light emitting diode.

7. The organic light emitting display device of claim 1, wherein at least one of an organic passivation layer or an inorganic passivation layer is disposed on the reflective layer.

8. The organic light emitting display device of claim 7, wherein further comprises a third passivation layer on the organic light emitting diode and the second passivation layer.

9. The organic light emitting display device of claim 6, wherein further comprises a third passivation layer on the organic light emitting diode and a second passivation layer is disposed on the organic light emitting diode and the reflective layer.

10. The organic light emitting display device of claim 1, wherein the first area is an area to display an image, and the second area is an area to reflect light.

11. The organic light emitting display device of claim 3, wherein the bank layer covers the edges of the anode and exposes center portion of the anode.

12. The organic light emitting display device of claim 2, further comprising a planarization layer on the first area of the substrate, wherein the anode is disposed on the planarization layer.

13. The organic light emitting display device of claim 12, wherein the planarization layer is not disposed on the second area of the substrate.

14. The organic light emitting display device of claim 4, wherein the bank layer is not disposed on the second area of the substrate.

\* \* \* \* \*